United States Patent [19]
Gardner et al.

[11] Patent Number: 6,013,546
[45] Date of Patent: Jan. 11, 2000

[54] SEMICONDUCTOR DEVICE HAVING A PMOS DEVICE WITH A SOURCE/DRAIN REGION FORMED USING A HEAVY ATOM P-TYPE IMPLANT AND METHOD OF MANUFACTURE THEREOF

[75] Inventors: Mark I. Gardner, Cedar Creek; H. Jim Fulford; Jack C. Lee, both of Austin, all of Tex.

[73] Assignee: Advanced Micro Devices, Inc., Sunnyvale, Calif.

[21] Appl. No.: 08/994,084

[22] Filed: Dec. 19, 1997

[51] Int. Cl.[7] ................................................ H01L 21/8249
[52] U.S. Cl. .......................... 438/231; 438/305; 438/528
[58] Field of Search .................................... 438/230, 231, 438/305, 528

[56] References Cited

U.S. PATENT DOCUMENTS

| | | |
|---|---|---|
| 4,683,645 | 8/1987 | Naguib et al. . |
| 4,835,112 | 5/1989 | Pfiester et al. . |
| 5,362,670 | 11/1994 | Iguchi et al. . |
| 5,602,045 | 2/1997 | Kimura . |
| 5,710,055 | 1/1998 | Kizilyalli . |
| 5,770,485 | 6/1998 | Gardner et al. . |
| 5,858,864 | 1/1999 | Aronowitz et al. . |

FOREIGN PATENT DOCUMENTS

WO 85/00694  2/1985  WIPO .

OTHER PUBLICATIONS

S. Wolf, "MOS Devices and NMOS Process Integration", *Silicon Processing for the VLSI Era—Volume II*, pp. 354–363 (1990).

*Primary Examiner*—Chandra Chaudhari
*Assistant Examiner*—Scott J. Hawranek

[57] ABSTRACT

A semiconductor device is formed which includes a shallow PMOS active region containing a heavy atom p-type dopant material. In an exemplary process for making a PMOS device or portion of a device, at least one PMOS gate electrode is formed over a PMOS device region of a substrate. A PMOS spacer is formed on a sidewall of a PMOS gate electrode. An amorphizing dopant material is selectively implanted into a PMOS active region using the PMOS spacer as a mask. A heavy atom p-type dopant material is selectively implanted into the PMOS active region using the PMOS spacer as a mask. The order of implantation of the amorphizing dopant material and the heavy atom p-type dopant material may be reversed.

22 Claims, 6 Drawing Sheets

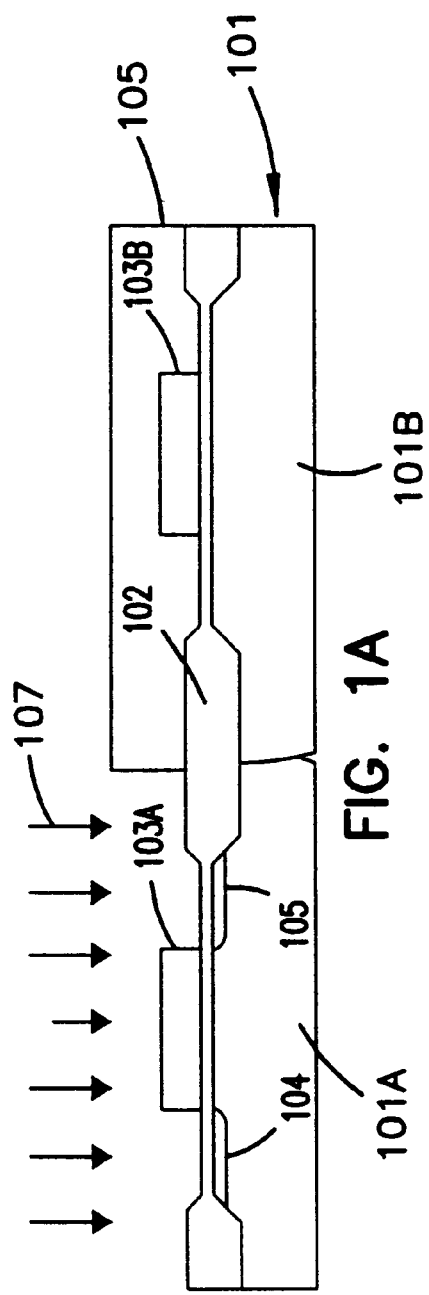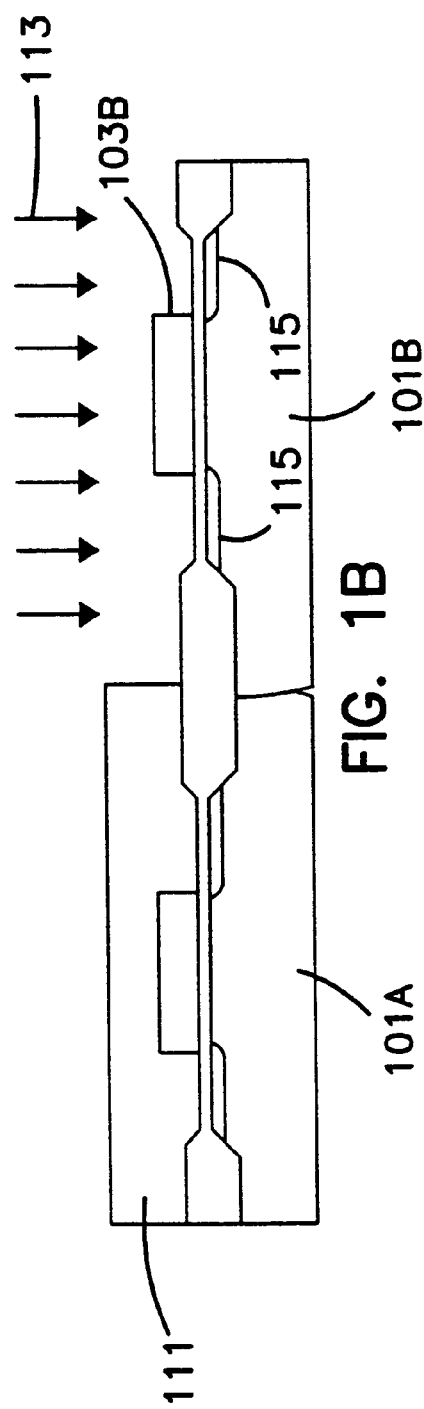

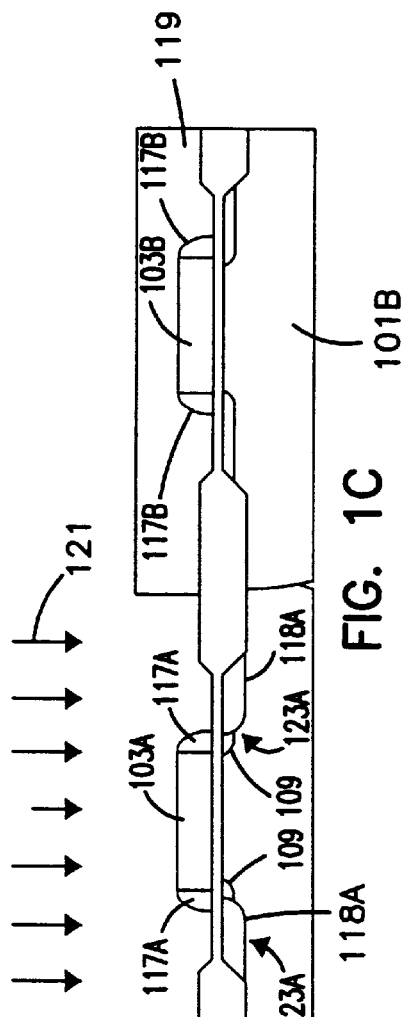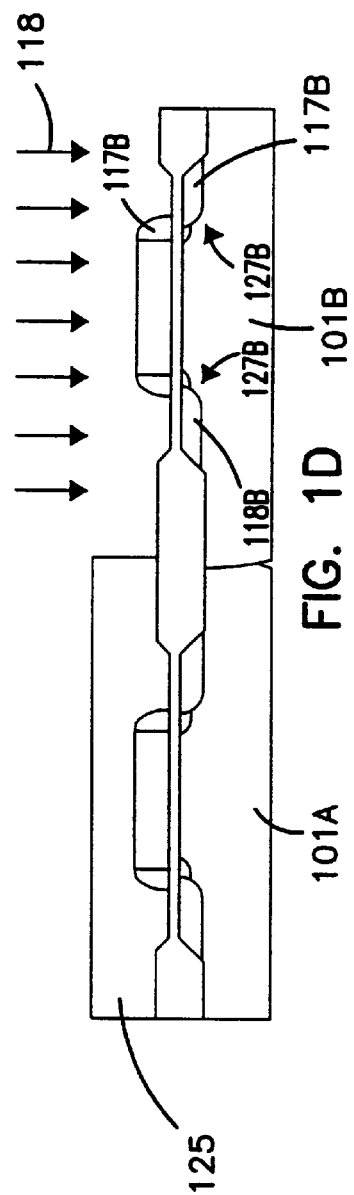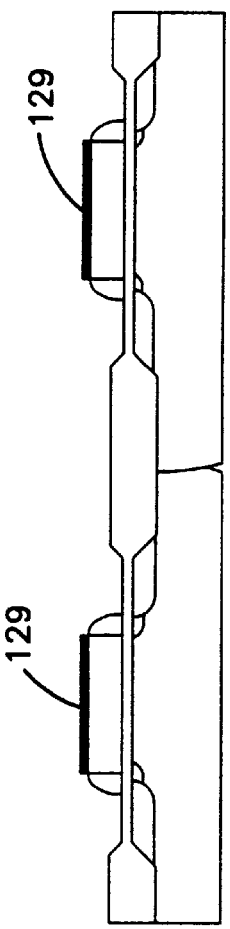

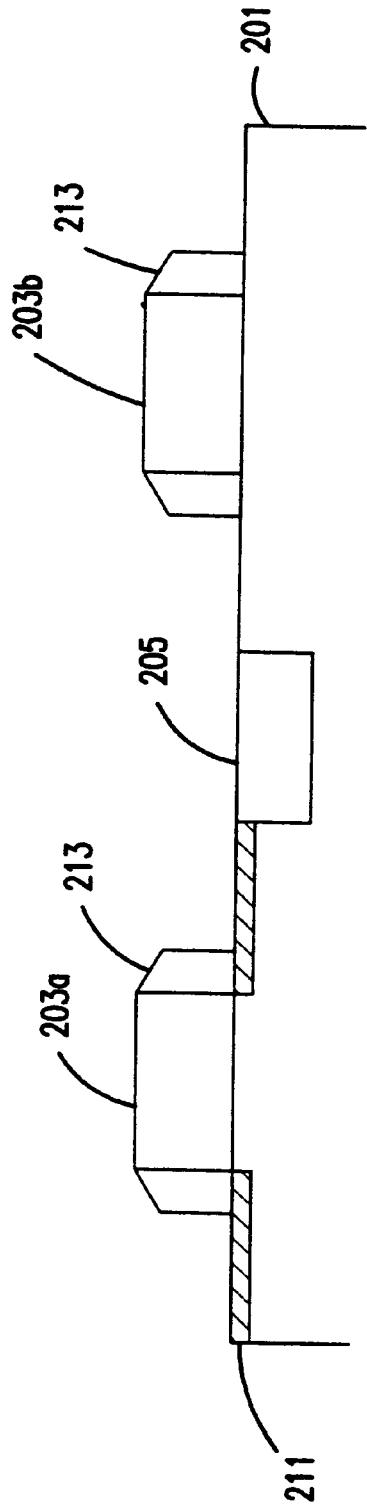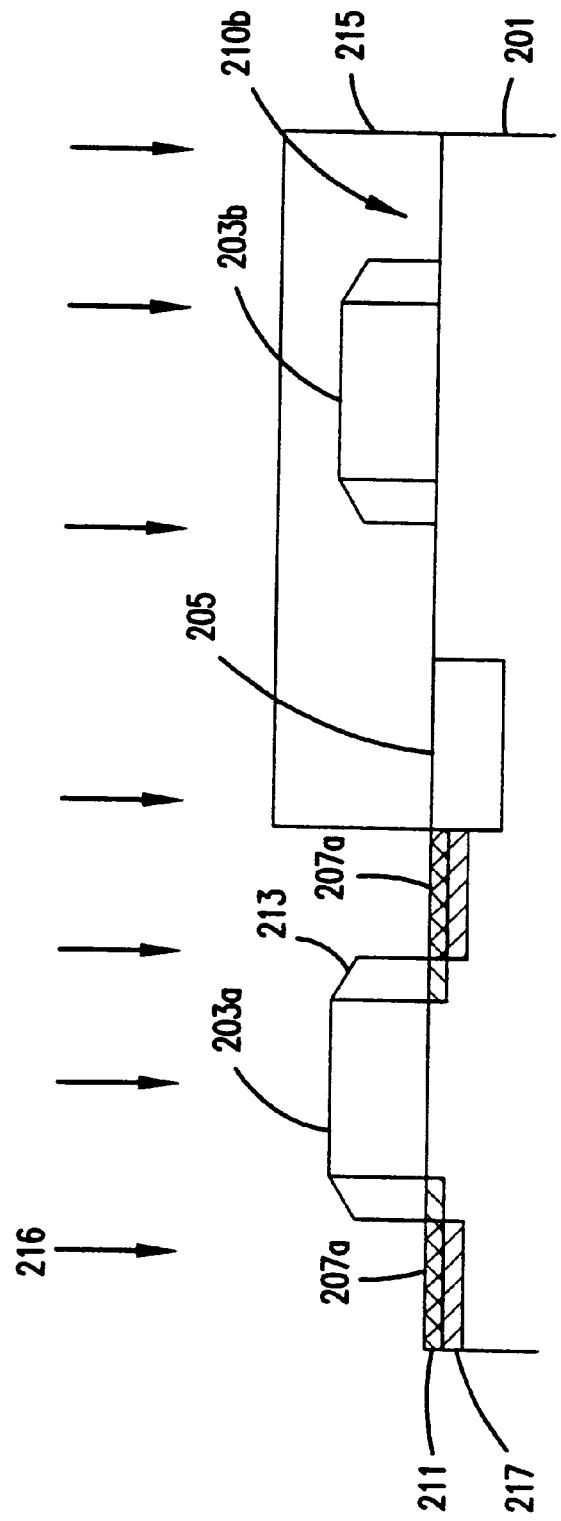

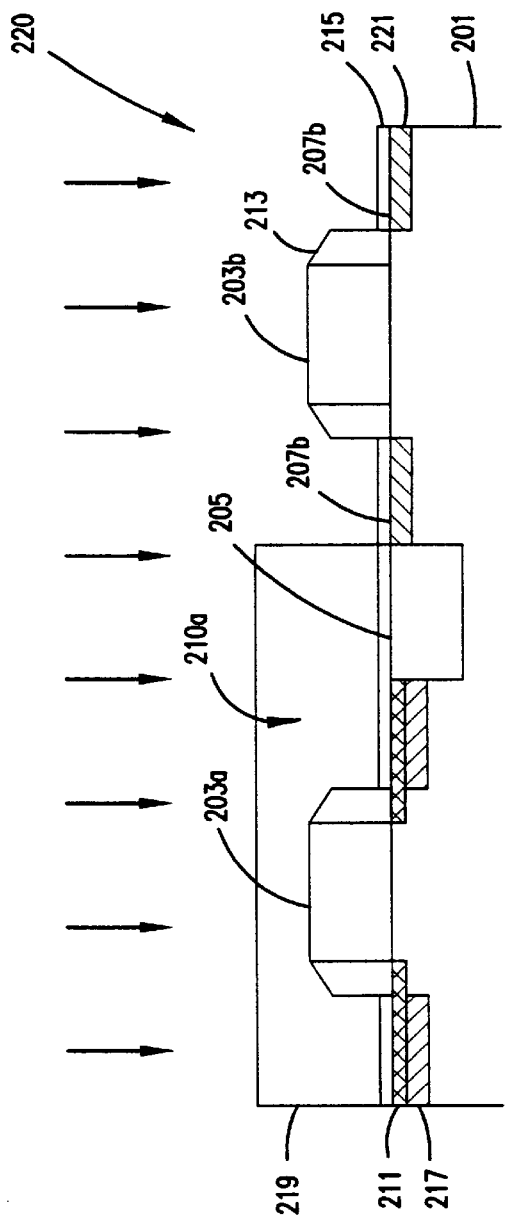
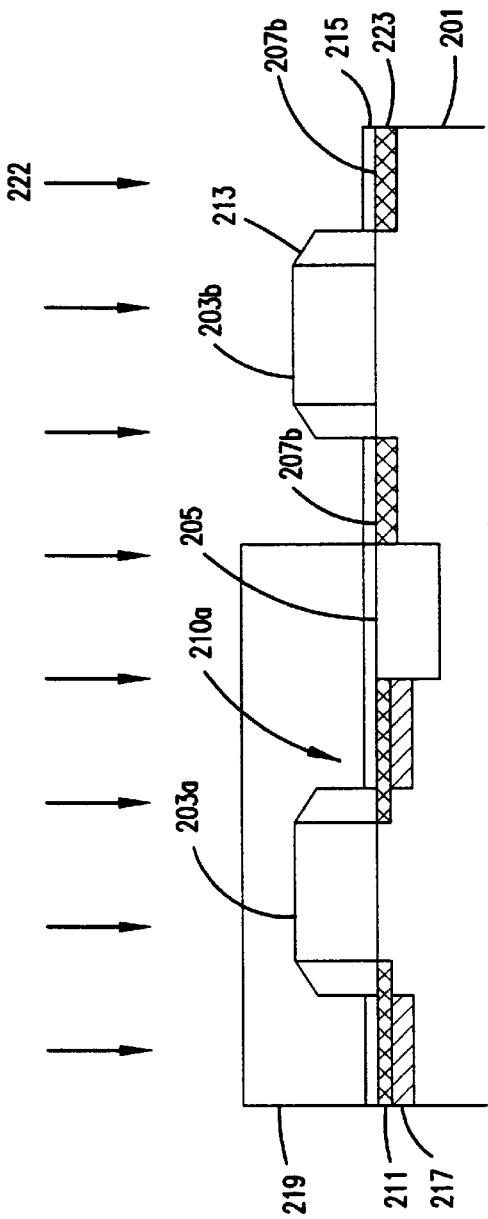

SEMICONDUCTOR DEVICE HAVING A PMOS DEVICE WITH A SOURCE/DRAIN REGION FORMED USING A HEAVY ATOM P-TYPE IMPLANT AND METHOD OF MANUFACTURE THEREOF

FIELD OF THE INVENTION

The present invention is, in general, directed to a semiconductor device and a method of manufacture thereof. More particularly, the present invention relates to a semiconductor device having a heavy atom p-type implant in a PMOS active region and a method of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by heavily doping the regions with a dopant material of a desired conductivity. The conductivity of the doped region depends on the type of impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly doped with a dopant material having a conductivity type opposite to that of the source and drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to controls the current flow through the channel region. This type of device is commonly referred to as a MOS field-effect-transistor (MOSFET).

MOS devices typically fall in one of two groups depending the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

Historically, only one type of device would be fabricated on a single wafer (i.e., only a single technology such as NMOS or PMOS would be used). As larger numbers of devices were formed on a wafer, increases in power density and dissipation inhibited the ability to use only a single technology. In response, complementary MOS (CMOS) technology was developed using both PMOS and NMOS transistors fabricated in a single substrate. While use of CMOS technology solves a number of problems, the technology is significantly more complex with respect to device physics. Moreover, since different types of dopant materials are being used, the complexity and cost of the fabrication process are both increased. For example, different masking and implantation steps are typically required to form doped regions for each type of dopant material in the substrate.

A number of different techniques and fabrication processes may be used to form CMOS devices. With reference to FIGS 1A–1E, one typical CMOS fabrication process will be described. The process depicted is used to form semiconductor structures having lightly doped drain (LDD) regions within the source and drain structures. As is well known, LDD structures are used in the formation of semiconductor devices having short channels in order to overcome problems associated therewith.

As depicted in FIG. 1A, a substrate 101 is divided into two device regions 101A and 101B. The two device regions 101A and 101B are of different conductivity types (n-channel and p-channel, respectively, in the illustrated embodiment) and are used to form the CMOS structures thereon. Different techniques may be used to form the two device regions 101A and 101B. The regions may be formed using an n-well in a p-type substrate, a p-well in an n-type substrate, twin wells in either an n- or p-type of substrate, etc. On the surface of the substrate 101, a field oxide, such as $SiO_2$, is generally provided to isolate the surface of the two device regions 101A and 101B. One or more gate electrodes 103 are formed on each of the device regions 101A and 101B. In the illustrated example, one gate electrode 103A is formed on the device region 101A and one gate electrode 103B is formed on the device region 101B.

An LDD region in the n-channel device region is first formed by masking the p-channel device region 101B with a mask layer 105 and implanting a relatively low dose of an n-type dopant material 107 into the exposed areas to form lightly doped (i.e., LDD) n-type regions 109 as illustrated in FIG. 1A. A second mask 111 is formed over the n-channel device region 101A and a p-type dopant material 113 is implanted into the p-channel device region 101B to form lightly doped (i.e., LDD) p-type regions 115 in the substrate adjacent the gate electrode 103B.

Following the LDD implants, a spacer layer is formed and etched to form spacers 117 on sidewalls of the gate electrodes 103A and 103B. The p-channel device region 101B is again masked with a mask layer 119 and a heavy dose of an n-type dopant material 121 is implanted into the substrate aligned with the spacers 117A to form heavily doped n-type regions 118A, as illustrated in FIG. 1C. In this manner, LDD structures 123A are formed in the substrate as illustrated in FIG. 1C.

In a manner similar to the n-channel region, the p-channel device region 101B is then exposed while masking the n-channel device region 101A with a mask layer 125. A high dose of a p-type dopant material 118 is implanted into the substrate using spacers 117B for alignment to form heavily doped p-type regions 118B. In this manner, LDD structures 127B are also formed in the p-channel device region 101B.

Following formation of the LDD structures, the mask 125 is typically removed and further processing such as silicidation and interconnect formation is performed. The resulting structure is depicted in FIG. 1E. A more detailed description of the elements and fabrication of LDD source/drain regions may be found in S. Wolf, *Silicon Processing for the VLSI Era*, Vol. 2: Processing Integration, pp. 354–363.

As noted above, the use of different types of dopant materials significantly increases the complexity of CMOS technology. For example, p-type dopant materials, such as boron, typically diffuse more rapidly in silicon than n-type dopant materials, such as arsenic. This places constraints on the heat treatment of the device and reduces the ability to control the profiles of source/drain regions.

The formation of LDD regions in CMOS devices further increases the complexity of fabricating CMOS devices. For example, the heavily doped n-type and p-type regions 118A and 118B must have adequate conductivity for device performance and sufficient depth to allow the formation of a silicide layer. Using the above conventional techniques to provide adequate conductivity and depth can cause excessive lateral diffusion of the heavily-doped n-type and p-type regions. This excessive lateral diffusion can in some instances overlap the lightly-doped n-type and p-type regions 109 and 115 and reduce the effective channel length.

SUMMARY OF THE INVENTION

Generally, the present invention relates to semiconductor devices having a PMOS active region with a shallow heavy atom p-type implant. One embodiment is a PMOS device which includes a substrate having at least one device region, at least one gate electrode on the device region, and an amorphized source/drain region adjacent to the gate electrode. The amorphized source/drain region includes a heavy atom p-type dopant material.

Another embodiment is a CMOS device having at least one NMOS device region, at least one PMOS device region, at least one NMOS gate electrode in the NMOS device region, at least one PMOS gate electrode in the PMOS device region, a NMOS source/drain region adjacent the NMOS gate electrode, and a PMOS source/drain region adjacent the PMOS gate electrode. At least a portion of the PMOS source/drain region is amorphized and contains a heavy atom p-type dopant material.

A further embodiment is a method for forming a semiconductor device. At least one NMOS gate electrode is formed over a NMOS device region of a substrate and at least one PMOS gate electrode is formed over a PMOS device region of a substrate. A first n-type dopant material is selectively implanted into an NMOS active region adjacent to the NMOS gate electrode to form a first n-doped region. A NMOS spacer is formed on a sidewall of the NMOS gate electrode and a PMOS spacer is formed on a sidewall of a PMOS gate electrode. A second n-type dopant material is then selectively implanted into the NMOS active region, using the NMOS spacer as a mask, to form a second n-doped region deeper than the first n-doped region. An amorphizing dopant material is selectively implanted into a PMOS active region using the PMOS spacer as a mask. A heavy atom p-type dopant material is also selectively implanted into the PMOS active region using the PMOS spacer as a mask.

Yet another embodiment is a method for forming a PMOS device. A gate electrode is formed over a device region of a substrate. The gate electrode defines an adjacent PMOS active region. A spacer is formed on a sidewall of the gate electrode. An amorphizing dopant material is then selectively implanted into the active region using the spacer as a mask. A heavy atom p-type dopant material is also selectively implanted into the active region using the spacer as a mask.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 1A through 1E illustrate a conventional process for forming a CMOS device; and FIGS. 2A through 2G illustrate an exemplary fabrication process in accordance with one embodiment of the invention.

Figure 2A:
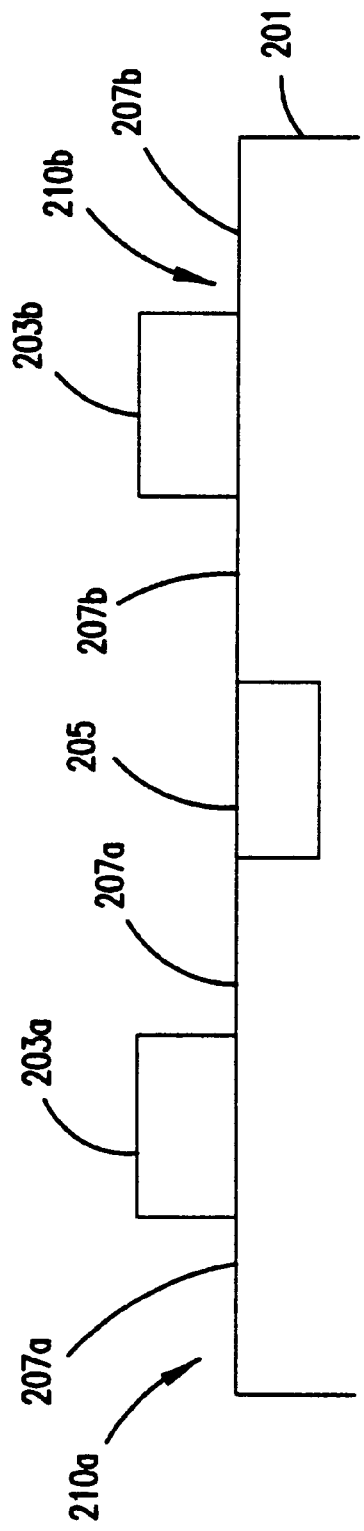

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices, including in particular, PMOS, CMOS, and BiCMOS structures. While the present invention is not so limited, an appreciation of various aspects of the invention will be gained through a discussion of the fabrication process and characteristics of such a device in connection with the examples provided below. In particular, the present invention is illustrated and described using an exemplary fabrication process for a CMOS device. It will, however, be appreciated that the invention also includes other semiconductor devices including PMOS and BiCMOS devices.

FIGS. 2A through 2G illustrate a process for fabricating a CMOS device in accordance with one embodiment of the present invention. Using known techniques, NMOS device regions and PMOS device regions are defined and gate electrodes are formed on a substrate 201 (only one gate electrode for each type of channel is shown), as illustrated in FIG. 2A. The NMOS device region 210a and PMOS device region 210b are typically separated by a field region (205). The gate electrode 203a in the NMOS device region 210a and the gate electrode 203b in the PMOS device region 210b are each typically insulated from the substrate 201 by a thin oxide layer (not shown). The resultant structure is illustrated in FIG. 2A. It will be appreciated that a number of different known fabrication techniques can be used to obtain the gate electrode structures depicted in FIG. 2A.

Portions of the semiconductor substrate 201 which lie adjacent the gate electrodes 203a and 203b generally define the active regions 207a and 207b of the substrate 201. As used herein, the term active region encompasses a region where an active portion of the device resides whether the active portion has been or will be formed. The active regions 207a and 207b may serve, for example, as source/drain regions of a semiconductor device.

The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrodes.

Figure 2B:
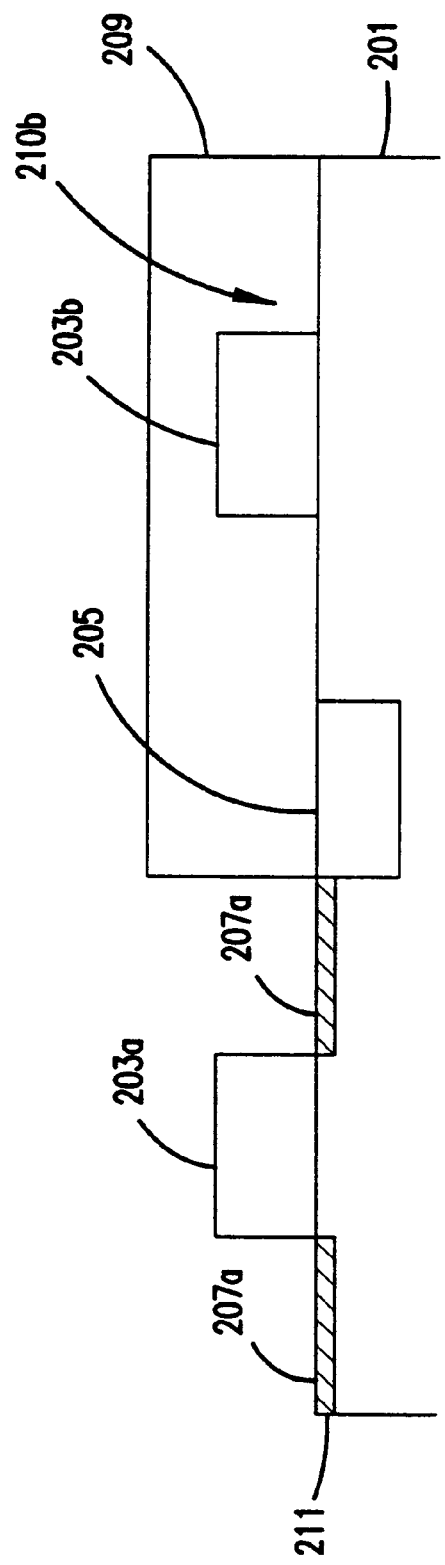

Following the formation of the gate electrodes 203a and 203b, a first mask 209 is formed to expose the NMOS active regions 207a and typically cover the PMOS device region 210b of the substrate 201, as shown in FIG. 2B. This first mask 209 may, for example, be formed by depositing, developing, and selectively removing a photoresist. An n-type dopant material 208 is implanted into exposed portions of the NMOS active regions 207a, to form first n-doped regions 211 in the NMOS active regions 207a. The n-type dopant material 208 is often arsenic (As) since arsenic is a larger atom relative to the silicon lattice than phosphorous (P) and therefore is less mobile in the silicon lattice. This allows greater control of the formation of the region 211. However, other n-type dopant materials may be used including, for example, phosphorus or nitrogen.

The first n-doped regions 211 are typically shallow, lightly-doped regions used to improve the hot carrier injection resistance of the device. The first n-doped regions 211 will also typically define the effective channel length of the device. Implant energies and dopant dosages are selected to optimize the characteristics of the n-doped regions 211. Suitable implant energies and dosages of the n-type dopant material 208 in the first n-doped regions 211 range from about 1 to 20 keV and 1E13 ($1\times10^{13}$) to 2E14 ($2\times10^{14}$) dopant atoms/cm$^2$, respectively.

The first mask 209 is removed and spacers 213 are formed on the sidewalls of the gate electrodes 203a and 203b, as shown in FIG. 2C. The spacers 213 may be formed using any of a number of known techniques. The resultant structure is illustrated in FIG. 2C. For example, conventional deposition (e.g., conformal chemical vapor deposition (CVD)) and etching techniques may be used to form the spacers 213. The spacers 213 are used to space subsequent p-type and n-type dopant material implants from the gate electrodes 203a and 203b, as will be discussed below.

The lateral width of the spacers 213 may be selected in consideration of the desired spacing of the implants. Suitable lateral widths of the spacers 213 range, for example, from 50 to 200 angstroms for many applications. However, larger or smaller spacers 213 may be used.

After the spacers 213 are formed, a second mask 215 is formed to expose portions of the NMOS active regions 207a and typically cover the PMOS device region 210b of the substrate 201. This may be done, for example, by depositing, developing, and selectively removing a photoresist. A second n-type dopant material 216 is implanted into the substrate 201 to form second n-doped regions 217 in the NMOS active regions 207a, as shown in FIG. 2D. Suitable n-type dopant material includes arsenic and phosphorus, for example.

The second n-doped regions 217 overlap with the first n-doped regions 211 and are typically deeper and more heavily-doped than the first n-doped regions 211. The implant energies and dosages of this implant are typically selected to provide the desired depth and resistivity of the second n-doped regions 217, while taking into consideration lateral diffusion of the second n-type dopant material 216 in the regions 217. In particular, the implant characteristics are selected to prevent the second n-doped regions 217 from laterally diffusing beyond the first n-doped regions 211. For many applications, suitable implant energies and dosages of the second n-type dopant material 216 range from about 1 to 20 keV and 8E14 ($8\times10^{14}$) to 7E15 ($7\times10^{15}$) dopant atoms/cm$^2$, respectively.

The second mask 215 is removed and the partially fabricated CMOS device is annealed using, for example, rapid thermal anneal (RTA) techniques. This activates the n-type dopant material in the first and second n-doped regions 211, 217, and also drives the n-type dopant material deeper into the substrate 201 and provides a more uniform distribution of the n-type dopant material within the first and second n-doped regions 211, 217. This may also cause some lateral diffusion of the n-type dopant material. The temperature to which the substrate 201 is heated typically ranges, for example, from 800 to 950° C. for periods of time ranging from, for example, 30 to 60 seconds.

This annealing process may also form a thin oxide layer 215 over the substrate 201, as depicted in FIG. 2E. This oxide layer may have a thickness which ranges, for example, from 50 to 200 angstroms.

A third mask 219 is formed to expose portions of the PMOS active regions 207b and typically cover the NMOS device region 210a of the substrate 201, as illustrated in FIG. 2E. This may be done, for example, by depositing, developing, and selectively removing a photoresist using conventional techniques.

The exposed portions of the PMOS active regions 207b are implanted, through the thin oxide layer 215, with an amorphizing dopant material 220 to create disorder in the crystal lattice structure of the substrate 201. This implantation generates amorphized portions 221 of the PMOS active regions 207b. The amorphization of the crystal structure typically reduces the diffusion of a subsequent or prior implanted p-type dopant material (e.g., dopant material 222 in FIG. 2F) as the amorphization reduces the number of free paths through which the implanted p-type dopant material may move.

This amorphization process facilitates the formation of a shallow p-type doping region (e.g., region 223 in FIG. 2F) by a p-type dopant implant. The amorphization process may also be performed after the p-type dopant material has been implanted. However, the amorphization should occur prior to an anneal (e.g., heating) step, otherwise the p-type dopant material will have already significantly diffused within the PMOS active regions 207b.

The amorphizing dopant material 220 may, for example, be carbon, N$_2$, silicon, or combinations thereof. N$_2$ may further confine the p-type dopant material 222 near the surface of the substrate 201. When implanting N$_2$, the implant peak is typically selected to be below the surface of the source/drain region. Furthermore, it has been found that an implant of carbon, either by itself or incombination with other amorphizing dopant material, enhances device properties. For many applications, suitable implant energies and dosages of an amorphization dopant material 222, such as carbon, silicon, or N$_2$, range from about 1 to 40 keV and 5E14 ($5\times10^{14}$) to 5E16 ($5\times10^{16}$) dopant atoms/cm$^2$, respectively.

The exposed portions of the PMOS active regions 207b are implanted with the p-type dopant material 222 to form p-type doped regions 223 in the PMOS active regions 207b, as illustrated in FIG. 2F. Suitable p-type dopant materials 220 are typically heavy atom species, such as indium and gallium.

The implant parameters are selected in consideration of the desired profile of the p-type dopant regions 223. For many applications, suitable implant energies and dosages of a p-type dopant material 222, such as indium or gallium, range from about 1 to 40 keV and 8E14 ($8 \times 10^{14}$) to 7E15 ($7 \times 10^{15}$) dopant atoms/cm$^2$, respectively.

Figure 2G:
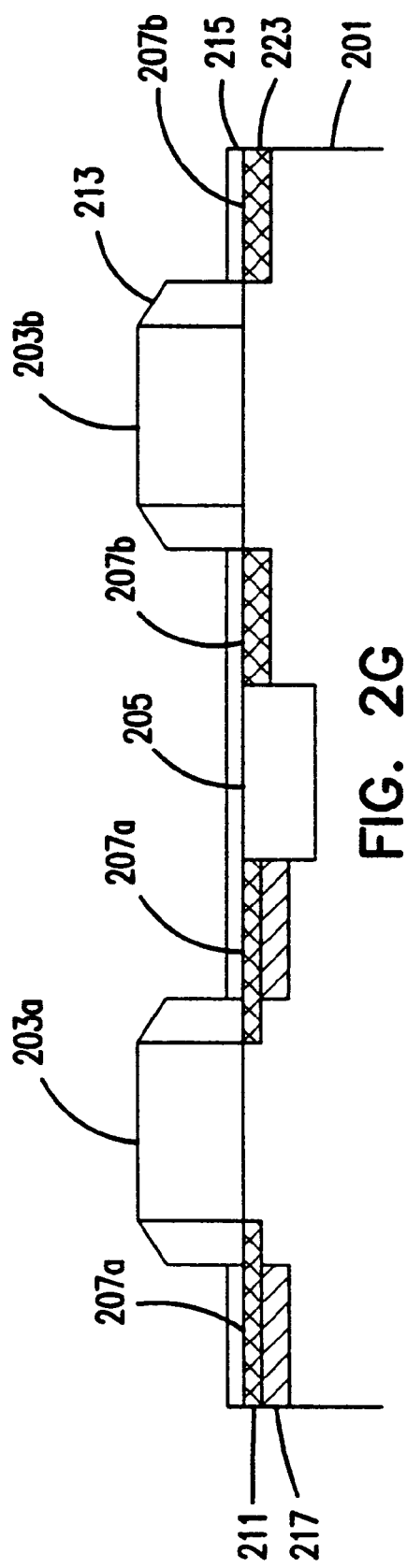

The third mask 219 is removed, as illustrated in FIG. 2G, and the substrate 201 is typically annealed using, for example, an RTA process, to activate the p-type dopant material 222 in the p-doped regions 223. This anneal is often performed using the same temperatures as the earlier anneal process. One exemplary anneal process includes an RTA treatment at, for example, 800 to 950° C. for, for example, 30 to 60 seconds.

Processing may subsequently continue with well-known fabrication steps, such as silicidation and contact formation, to complete the device structure. Depending on the type of silicidation used, an additional spacer may be formed.

Using the above process, PMOS source/drain regions of, for example, PMOS, CMOS, and BiCMOS devices can be more reliably controlled. In particular, the extent of lateral diffusion of the p-type dopant material in the PMOS source/drain regions can be reduced. Control over and reduced diffusion of PMOS source/drain regions is provided as a result of the low mobility of the heavy atom p-type dopant material, in combination with the diffusion-inhibiting characteristics of the amorphization region. All of these factors contribute to the formation of a PMOS device region with active regions that are not shorted-out due to diffusion of the p-type dopant material across the channel. This, for example, allows for aggressive scaling of PMOS or other devices.

The resultant structure, as shown in FIG. 2G, includes a PMOS electrode 203b adjacent to PMOS active regions 207b (e.g., source/drain regions) that include an amorphized area 223 containing heavy atom p-type dopant material 222. The CMOS embodiment also includes a NMOS electrode 203a adjacent to NMOS active regions 207b which include one or more regions (e.g., regions 211, 217) of n-type dopant material. While the above process is illustrated in conjunction with a CMOS device, the process is not so limited. The above process can be used to form a number of different semiconductor devices, including but not limited to PMOS, CMOS, and BiCMOS devices. Moreover, while the above embodiment illustrates the formation of a CMOS device with LDD (lightly doped drain) n-type source/drain regions, the present invention is not so limited. A number of different n-type source/drain regions may be formed and the invention is intended to cover these alternatives.

As noted above, the present invention is applicable to the fabrication of a number of different devices in which PMOS source/drain regions are formed using heavy atom dopant material. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method for forming a semiconductor device, comprising:
    forming at least one NMOS gate electrode over a NMOS device region of a substrate and at least one PMOS gate electrode over a PMOS device region of a substrate;
    selectively implanting a first n-type dopant material into an NMOS active region adjacent to the NMOS gate electrode to form a first n-doped region;
    forming a NMOS spacer on a sidewall of the NMOS gate electrode and a PMOS spacer on a sidewall of the PMOS gate electrode;
    selectively implanting a second n-type dopant material into a portion of the NMOS active region using the NMOS spacer as a mask, the implanted second n-type dopant material forming a second n-doped region deeper than the first n-doped region;
    selectively implanting an amorphizing dopant material into a PMOS active region adjacent to the PMOS gate electrode using the PMOS spacer as a mask; and
    selectively implanting a heavy atom p-type dopant material into the PMOS active region using the PMOS spacer as a mask.

2. The method of claim 1, further comprising forming a masking layer over an NMOS region of the CMOS semiconductor device prior to implanting the heavy atom p-type dopant material.

3. The method of claim 1, further comprising annealing the substrate subsequent to implanting the second n-type dopant material.

4. The method of claim 1, further comprising annealing the substrate subsequent to implanting the p-type dopant material.

5. The method of claim 1 wherein selectively implanting the amorphizing dopant material comprises
    forming a masking layer over the substrate,
    selectively removing a portion of the masking layer to expose the PMOS active region and cover the NMOS region, and
    selectively implanting the amorphizing dopant material into the exposed PMOS active region.

6. The method of claim 1, wherein the heavy atom p-type dopant material is implanted prior to the amorphizing dopant material.

7. The method of claim 1, wherein a dopant dosage of the heavy atom p-type dopant material ranges from 8E14 to 7E15 dopant atoms/cm$^2$.

8. The method of claim 1, wherein an implant energy of the heavy atom p-type dopant material ranges from 1 to 40 keV.

9. The method of claim 1, wherein a dopant dosage of the amorphizing dopant material ranges from 5E14 to 5E15 dopant atoms/cm$^2$.

10. The method of claim 1, wherein an implant energy of the amorphizing dopant material ranges from 1 to 40 Rev.

11. The method of claim 1, wherein the heavy atom p-type dopant material is indium, gallium, or combinations thereof.

12. The method of claim 1, wherein the amorphizing dopant material is carbon, silicon, N$_2$, or combinations thereof.

13. The method of claim 1, wherein the amorphizing dopant material comprises carbon.

14. The method of claims 1, wherein the heavy atom p-type dopant material is implanted prior to the amorphizing dopant material.

15. The method of claim 1, wherein the amorphizing dopant material is nitrogen.

16. A method for forming a semiconductor device, comprising:

forming at least one NMOS gate electrode over a NMOS device region of a substrate and at least one PMOS gate electrode over a PMOS device region of the substrate;

selectively implanting a first n-type dopant material into an NMOS active region adjacent to the NMOS gate electrode to form a first n-doped region;

forming NMOS spacers on sidewalls of the NMOS gate electrode and PMOS spacers on sidewalls of the PMOS gate electrode;

selectively implanting a second n-type dopant material into a portion of the NMOS active region using the NMOS spacers as a mask, the implanted second n-type dopant material forming a second n-doped region deeper than the first n-doped region;

selectively implanting an amorphizing dopant material into an exposed portion of the substrate adjacent to the PMOS gate electrode using the PMOS spacers as a mask; and selectively implanting a heavy atom p-type dopant material into the exposed portion of the substrate using the PMOS spacers as a mask to form a PMOS active region.

17. The method of claim 16, wherein selectively implanting a heavy atom p-type dopant material comprises selectively implanting a heavy atom p-type dopant material into the exposed portion of the substrate using the PMOS spacers as a mask to form PMOS source/drain regions.

18. The method of claim 16, wherein selectively implanting a heavy atom p-type dopant material comprises selectively implanting a heavy atom p-type dopant material into the exposed portion of the substrate using the PMOS spacers as a mask to form symmetric PMOS source/drain regions.

19. The method of claim 16, wherein the heavy atom p-type dopant material is indium, gallium, or combinations thereof.

20. The method of claim 16, wherein the amorphizing dopant material is carbon, silicon, $N_2$, or combinations thereof.

21. The method of claim 16, wherein the amorphizing dopant material comprises carbon.

22. The method of claim 16, wherein the amorphizing dopant material is nitrogen.

* * * * *